United States Patent
Beltran

(10) Patent No.: US 11,632,613 B2
(45) Date of Patent: Apr. 18, 2023

(54) AUDIO DOOR SYSTEM

(71) Applicant: Clay Laboratories, LLC, The Colony, TX (US)

(72) Inventor: Joshua Beltran, The Colony, TX (US)

(73) Assignee: Clay Laboratories, LLC, The Colony, TX (US)

( * ) Notice: Subject to any disclaimer, the term of this patent is extended or adjusted under 35 U.S.C. 154(b) by 35 days.

(21) Appl. No.: 17/362,481

(22) Filed: Jun. 29, 2021

(65) Prior Publication Data

US 2022/0417630 A1 Dec. 29, 2022

(51) Int. Cl.
| | |
|---|---|
| *H04R 3/00* | (2006.01) |
| *H04R 1/02* | (2006.01) |
| *H03F 3/183* | (2006.01) |
| *H04R 7/04* | (2006.01) |
| *E06B 7/28* | (2006.01) |
| *E06B 5/00* | (2006.01) |

(52) U.S. Cl.
CPC ............... *H04R 1/028* (2013.01); *E06B 7/28* (2013.01); *H03F 3/183* (2013.01); *H04R 3/00* (2013.01); *H04R 7/04* (2013.01); *E06B 5/00* (2013.01); *H03F 2200/03* (2013.01); *H04R 2201/028* (2013.01); *H04R 2420/07* (2013.01)

(58) Field of Classification Search
CPC . H04R 3/00; H04R 3/005; H04R 7/04; H04R 2420/07; H04R 2201/028; H03F 3/183; H03F 2200/03; E06B 5/00; E06B 7/28; E06B 2007/305
See application file for complete search history.

(56) References Cited

U.S. PATENT DOCUMENTS

2017/0338860 A1* 11/2017 Zou ..................... H04B 5/0037

FOREIGN PATENT DOCUMENTS

| CN | 103673496 A | * | 3/2014 | |
| DE | 102015103527 A1 | * | 9/2016 | |
| EP | 2027749 B1 | * | 8/2017 | .............. F24C 7/082 |

OTHER PUBLICATIONS

DE-102015103527-A1, English Translation, Date: Sep. 2016.*
https://www.biamp.com/products/product-families/cambridge; Cambridge Products; Last accessed on Feb. 22, 2022.
https://www.uwpsite.com/index.php?main_page=product_info &products_id=89239; Dayton Audio DAEX19QLP-4 Quad Feet Low Profile 19mm Exciter5W 4 Ohm; Last accessed on Jun. 21, 2021.
Diodes Incorporated; PAM8302A, 2.5W Filterless Class-D Mono Audio Amplifier; Document No. DSxxxxx Rev. 2-5; Apr. 2013.

* cited by examiner

*Primary Examiner* — Thang V Tran
(74) *Attorney, Agent, or Firm* — Akerman LLP

(57) ABSTRACT

According to one example, an audio door system includes a door, an audio system, an amplifier, and an exciter. The audio system is coupled to the door. The amplifier is coupled to the door, and is electrically coupled to the audio system. The exciter is coupled to the door, and is electrically coupled to the amplifier. The exciter can transform an audio electrical signal into mechanical energy, and can further cause a surface of the door to transform the mechanical energy into one or more acoustic sound waves.

15 Claims, 6 Drawing Sheets

AUDIO DOOR SYSTEM

TECHNICAL FIELD

This disclosure relates generally to the field of audio transmission, and more specifically to an audio door system.

BACKGROUND

Typically, when a person desires sound/speech privacy in their office or residence, the person may add additional insulation to the walls of the office or residence. When a person desires an intercom system in their office or residence, the person may install intercom loudspeakers and microphones in the walls and ceilings of each room. When a person desires auditory sleep therapy in their bedroom, the person may purchase a noise device. When a person desires music throughout their office or residence, the person may add internal or external loudspeakers throughout their office or residence. Each of these traditional solutions, however, may be deficient.

SUMMARY

In a first example, an audio door system includes a door, an audio system, an amplifier, and an exciter. The audio system is coupled to the door. The amplifier is coupled to the door, and is electrically coupled to the audio system. The exciter is coupled to the door, and is electrically coupled to the amplifier. The exciter can transform an audio electrical signal into mechanical energy, and can further cause a surface of the door to transform the mechanical energy into one or more acoustic sound waves.

In a second example, a method includes coupling an audio system to a door. The method further includes coupling an amplifier to the door, and electrically coupling the amplifier to the audio system. The method also includes coupling an exciter to the door, and electrically coupling the exciter to the amplifier. The exciter can transform an audio electrical signal into mechanical energy, and can further cause a surface of the door to transform the mechanical energy into one or more acoustic sound waves.

In a third example, an audio door system includes a door that can play audio received from any smart device. The audio door system may include multiple doors, so as to provide home wireless audio connectivity, in some examples. In some examples, the audio door system may provide whole home audio for speech privacy, auditory sleepy therapy, intercom, and background music, all without any visible wires or electronics. The user may stream audio to a single door, multiple doors, or all doors (e.g., a party mode where a user may pair to all doors and stream content from a single source). Furthermore, a user may stream two zones of audio to each door, in some examples. The audio door system may also allow for streaming audio content through obstructions commonly seen in home construction, such as sheetrock, insulation, wood, and paint, in some examples.

In a fourth example, a system includes a light switch plate and a wireless power transmitter coupled to a back surface of the light switch plate. The light switch plate can be coupled to a mounting box or to a light switch. The wireless power transmitter can wirelessly transmit power to a wireless power receiver, such as a wireless power receiver coupled to a door.

BRIEF DESCRIPTION OF THE FIGURES

For a more complete understanding of the present disclosure and its features and advantages, reference is now made to the following description, taken in conjunction with the accompanying drawings, in which.

DETAILED DESCRIPTION

Embodiments of the present disclosure are best understood by referring to FIGS. 1-5 of the drawings, like numerals being used for like and corresponding parts of the various drawings.

Typically, when a person desires sound/speech privacy in their office or residence, the person may add additional insulation to the walls of the office or residence. When a person desires an intercom system in their office or residence, the person may install intercom loudspeakers and microphones in the walls and ceilings of each room. When a person desires auditory sleep therapy in their bedroom, the person may purchase a noise device. When a person desires music throughout their office or residence, the person may add internal or external loudspeakers throughout their office or residence. Each of these traditional solutions, however, may be deficient. For example, each of these solutions may only solve one of the desires of the person, requiring the person to implement multiple solutions if they have multiple desires. This can be expensive, complicated, and/or may not fully satisfy each desire (e.g., insulation may not provide adequate speech privacy). Contrary to this, the audio door system 10 described herein may address one or more of these deficiencies.

Figure 1:
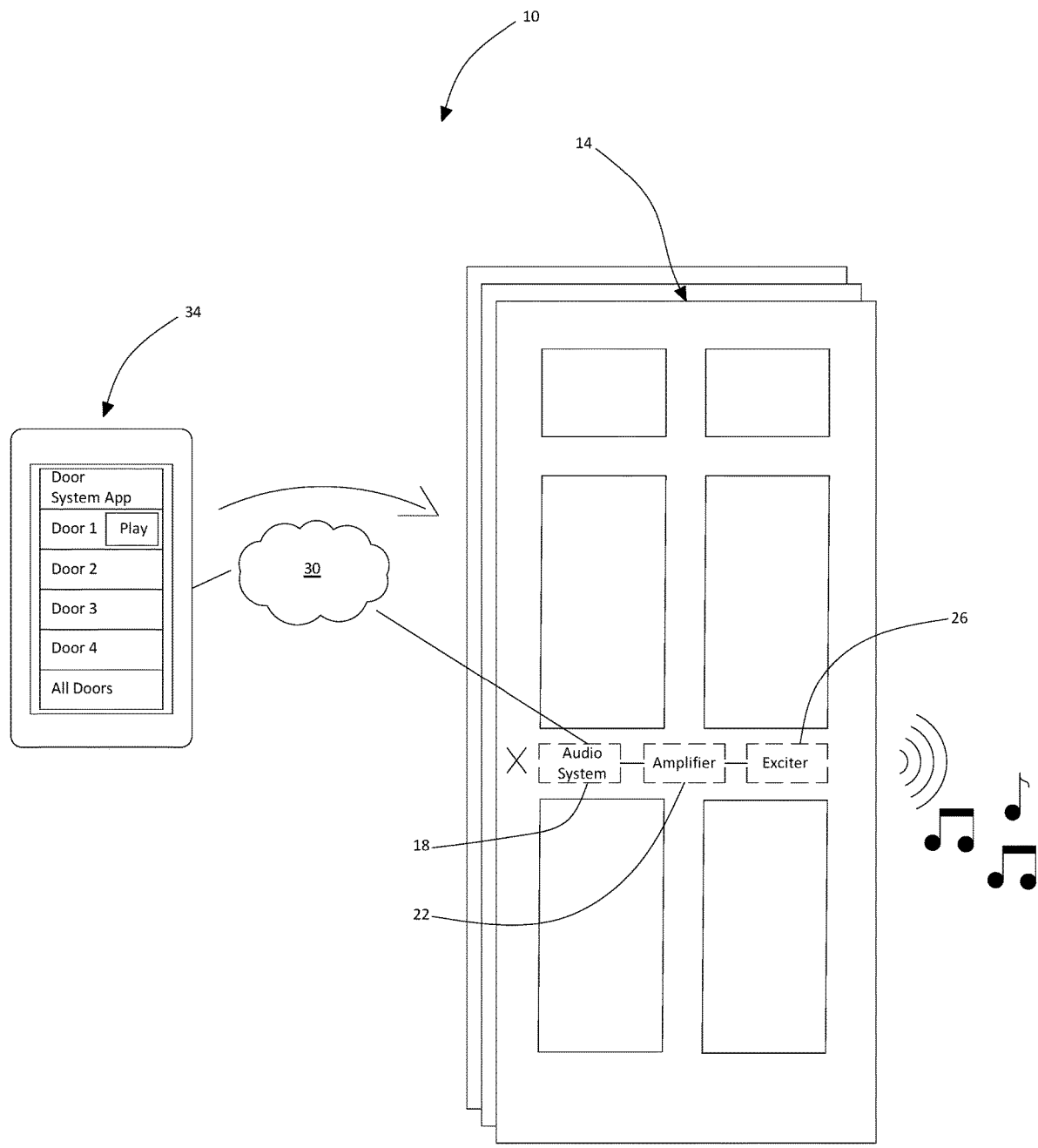
FIG. 1 illustrates an example audio door system.

FIG. 1 illustrates an example audio door system 10 that utilizes one or more surfaces of a door 14 to produce acoustic sound waves via an audio system. In the illustrated example, the audio door system 10 includes an audio system 18, an amplifier 22, and an exciter 26 coupled to the door 14 (e.g., coupled inside of the door 14). In an example of operation of the audio door system 10, a user may utilize a user device 34 (e.g., a Smartphone, tablet, laptop) to select audio (e.g., speech privacy noise, an intercom page, sleep therapy noise, music) to transmit to the door 14. This selected audio is received wirelessly at the audio system 18, which provides the audio in the form of electrical signals to the amplifier 22 and then the exciter 26, where the audio electrical signals are transformed into mechanical energy. This mechanical energy is then provided by the exciter 26 to a surface of the door 14 (e.g., the skin of the door), causing the surface of the door 14 to transform the mechanical energy into acoustic sound waves (e.g., by exciting the surface). As such, the door 14 produces the audio (e.g., plays the speech privacy noise, the intercom page, the sleep therapy noise, the music) selected by the user.

In some examples, the audio door system 10 allows a user to play speech privacy noise in their office or residence (via a door 14), transmit an intercom page (e.g., "It's time for dinner") to their office or residence (via doors 14), play sleep therapy noise in their bedroom (via a door 14), play music throughout their residence (via doors 14) or to a specific room (via a door 14), play any other audio (via a door 14), or any combination of the preceding. Furthermore, it also allows the user to control this audio from the user device 34 (e.g., the user's Smartphone, tablet, laptop), in some examples.

In the example illustrated in FIG. 1, the audio door system 10 includes a door 14. The door 14 refers to any moveable barrier (e.g., movable via hinges, sliding, revolving) that may be positioned at the entrance/exit of a building, room, or structure. The door 14 may be used in any kind of building, room, or structure. For example, the door 14 may be used in a residential building (e.g., a house, a condominium, an apartment building, a townhome), a commercial building (e.g., an office building, a warehouse), any other building, or any combination of the preceding. The door 14 may be an exterior door (e.g., front door, back door, side-entrance door) or an internal door (e.g., bedroom door, bathroom door, kitchen door, closet door). The door 14 may be a solid door (e.g., solid-core door), a semi-solid door, a hollow-core door, any other type of door, or any combination of the preceding. The door 14 may be made of any material that can be used to produce acoustic sound waves. For example, the door 14 may be made of wood, fiberglass, steel, any other material that can be used to produce acoustic sound waves, or any combination of the preceding. In the illustrated example, the door 14 is a hollow-core door having outer skins made of fiberglass, and the door 14 is used as bedroom door of a house. The door 14 may have any color(s), such as white, ivory, ebony, blue, pink, any other color, or any combination of the preceding.

The audio door system 10 may include any number of doors 14. For example, the audio door system 10 may include one door 14, two doors 14, or three or more doors 14. When using multiple doors 14, the doors 14 may be used at different locations throughout the building. For example, the doors 14 may be used (or may otherwise be installed at) the entrance of each of the bedrooms, bathrooms, and the kitchen of a house (or other residence). This allows the audio door system 10 to provide audio throughout the house, in some examples.

In the example illustrated in FIG. 1, the audio door system 10 includes an audio system 18, an amplifier 22, and an exciter 26, each of which are coupled to a door 14. The audio system 18 refers to device (or one or more components) that provides audio in the form of electrical signals. Examples of an audio system 18 include an audio receiver (e.g., wired or wireless), a memory unit and processing unit that stores, retrieves, and provides audio files (e.g., pre-stored or downloadable white noise files), a media player (e.g., an MP3 player), any other device (or components) that provides audio in the form of electrical signals, or any combination of the preceding.

In the illustrated example, the audio system 18 is a wireless audio receiver. This wireless audio receiver may receive audio signals from the user device 34, and may provide those audio signals in the form of electrical signals. For example, the wireless audio receiver may receive audio signals (e.g., streaming) from the user device 34. The wireless audio receiver may utilize any wireless communication protocol to receive audio signals. For example, the wireless audio receiver may be a BLUETOOTH enabled wireless audio receiver (e.g., Institute of Electrical and Electronics Engineers (IEEE) 802.15.1). Such a wireless audio receiver may receive and utilize audio signals through ultra-high frequency radio waves ranging from 2.402 GHz to 2.48 GHz, in some examples. As another example, the wireless audio receiver may be a WI-FI enabled wireless audio receiver, or a wireless audio receiver capable of receiving and utilizing any audio signals over network 30 (discussed below). In some examples, the wireless audio receiver encompasses a receiver and/or a transceiver.

The amplifier 22 refers to device (or one or more components) that receives audio electrical signals from the audio system 18 and amplifies (e.g., increases) the electrical signals. The amplifier 22 may be any amplifier that may be used to amplify a signal for reception by one or more exciters 26. In the illustrated example, the amplifier 22 is a 2.5 W Class-D mono audio amplifier (e.g., model number PAM8302A) manufactured by DIODES INCORPORATED.

The exciter 26 refers to a device (or one or more components) that receives the audio electrical signals from the amplifier 22 and transforms these audio electrical signals into mechanical energy. The exciter 26 may be any exciter that may be used to transform audio electrical signals into mechanical energy. In the illustrated example, the exciter 26 is a Quad Feet Low Profile 19 mm Exciter 5W 4 Ohm (e.g., model number DAEX19QLP-4) manufactured by DAYTON AUDIO.

As is discussed above, the exciter 26 transforms audio electrical signals into mechanical energy. The exciter 26 itself, however, does not transform the mechanical energy into acoustic sound waves. The reason for this is because the exciter 26 does not include a complete diaphragm. This lack of a complete diaphragm causes the exciter 26 to be different from a conventional loudspeaker, which does include a complete diaphragm, and which does transform mechanical energy into acoustic sound waves.

Instead of including a complete diaphragm, the exciter 26 may be configured to utilize a surface of the door 14 (e.g., a skin of a hollow-core door) as the diaphragm (or a portion of a complete diaphragm). This allows the exciter 26 to transfer mechanical energy to the surface of the door 14, and the surface of the door 14 will transform the mechanical energy into acoustic sound waves (e.g., by the exciter 26 exciting the surface of the door). In some examples, the door 14 may produce frequencies between 150 Hz and 4 kHz at 60 dB SPL at 1 meter on axis. The exciter 26 may be configured in any manner to utilize a surface of the door 14 as the diaphragm (or a portion of a complete diaphragm). For example, the exciter 26 may be coupled (e.g., attached) directly or indirectly to the surface of the door 14 so that the mechanical energy from the exciter 26 is transferred directly or indirectly to the surface of the door 14. The exciter 26 may be coupled (e.g., attached) directly or indirectly to the surface of the door 14 in any manner, such as using an adhesive (e.g., glue, tape, paint), connectors (e.g., screws), any other manner, or any combination of the preceding.

Figure 4:
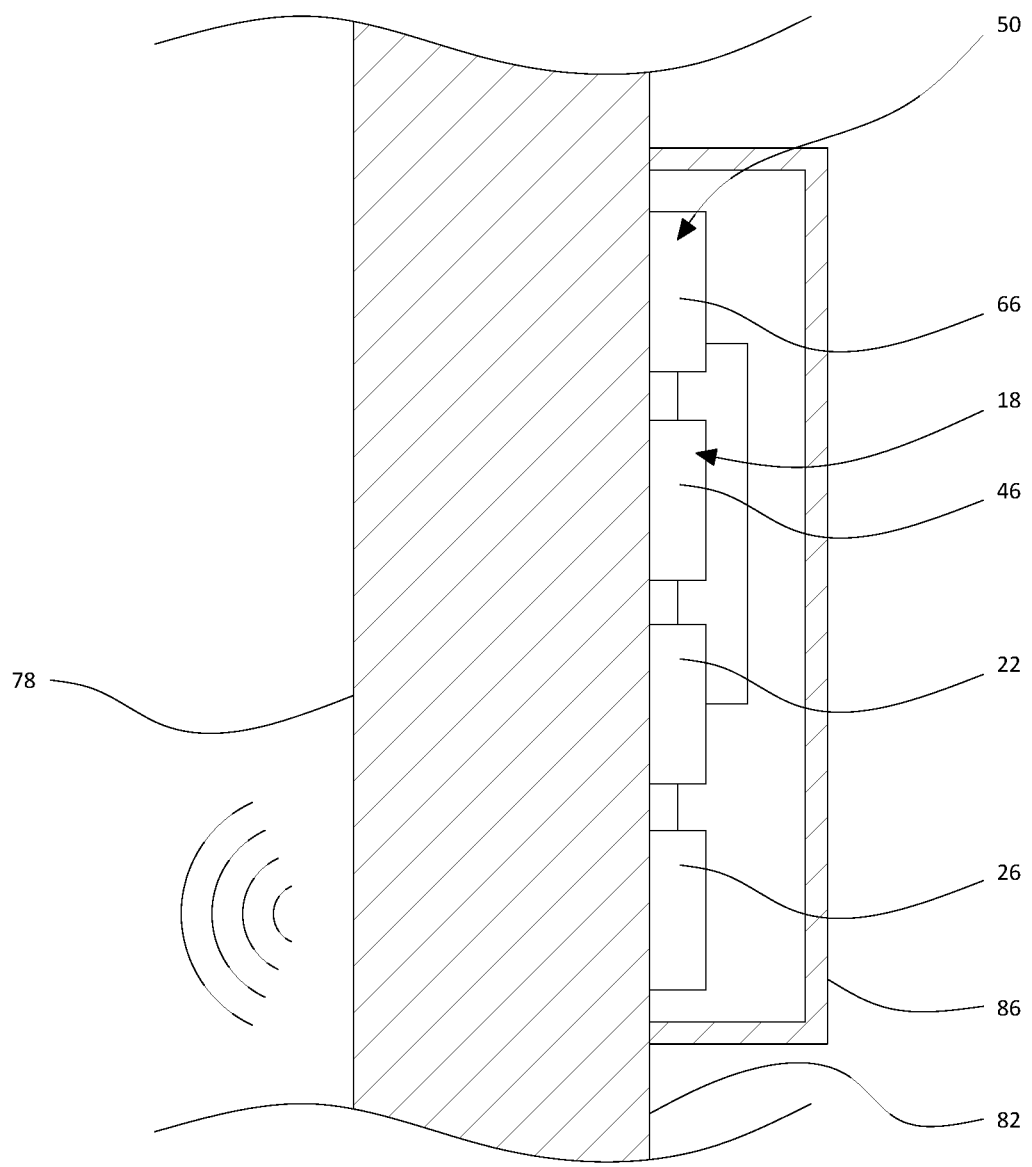
FIG. 4 is a cross-sectional view of a portion of another example door of an audio door system.

As is discussed above, each of the audio system 18, amplifier 22, and exciter 26 are coupled to a door 14. Each of these components (and any other components) may be coupled at any location on or in the door 14. For example, each of these components may be coupled inside of the door 14, as is illustrated in FIG. 1. This allows the door 14 to provide acoustic sound wave(s) to be heard by user(s), without one or more (or all of the) components being visible. For example, there may be no visible wires, electronics, audio system 18, amplifier 22, exciter 26, or other components. In other examples, one or more (or all) of these components may be coupled to the exterior of the door. For example, the components may be coupled to an exterior surface of a solid door, an example of which is illustrated in FIG. 4. In such an example, the components may be held in (or otherwise) covered by a panel, box, or other structure that is also coupled to the solid door. This panel, box, or other structure may prevent the components from being visible, even though they are coupled to the exterior of the door. The components may be coupled (e.g., attached) directly or indirectly to door 14 in any manner, such as using an adhesive (e.g., glue, tape, paint), connectors (e.g., screws), any other manner, or any combination of the preceding. Also, the components may be coupled to different surfaces of the door 14. For example, the exciter 26 may be coupled to a first surface of the door, while one or more of the other components may be coupled to a second different surface.

Any number of audio systems 18, amplifiers 22, exciters 26 and/or other components may be coupled to each door 14 of the audio door system 10. For example, the door 14 may have one or more audio systems 18, one or more amplifiers 22, and one or more exciters 26 coupled to the door 14. In an example of this, the door 14 has two audio systems 18 (or one audio system 18), two or more amplifiers 22, and two or more exciters 26 coupled to the door 14. In an example where the door 14 has two (or more) exciters 26 coupled to the door 14, a first exciter 26 may be coupled to a first surface of the door 14 (e.g., a first skin of a hollow-core door) and a second exciter 26 may be coupled to a second surface of the door (e.g., a second skin of the hollow-core door). This may allow each of the two surfaces of the door 14 to emit different acoustic sound waves, so that a first audio (e.g., white noise) can be heard from the first surface of the door 14, and further so that a second audio (e.g., speech privacy noise) can be heard from the second surface of the door 14.

One or more of the audio systems 18, amplifiers 22, exciters 26 and/or other components that are coupled to a door 14 may also be electrically coupled (e.g., via one or more electrical wires and/or other components) to each other. In the example illustrated in FIG. 1, the audio system 18 is electrically coupled (e.g., via one or more electrical wires and/or other components) directly or indirectly to the amplifier 22, and the amplifier 22 is electrically coupled (e.g., via one or more electrical wires and/or other components) directly or indirectly to the exciter 26. These electrical couplings may allow signals to be transmitted in-between the components of the door 14. One or more of the components of the door 14 may be coupled in series with each other, or parallel to each other.

Figure 2A:
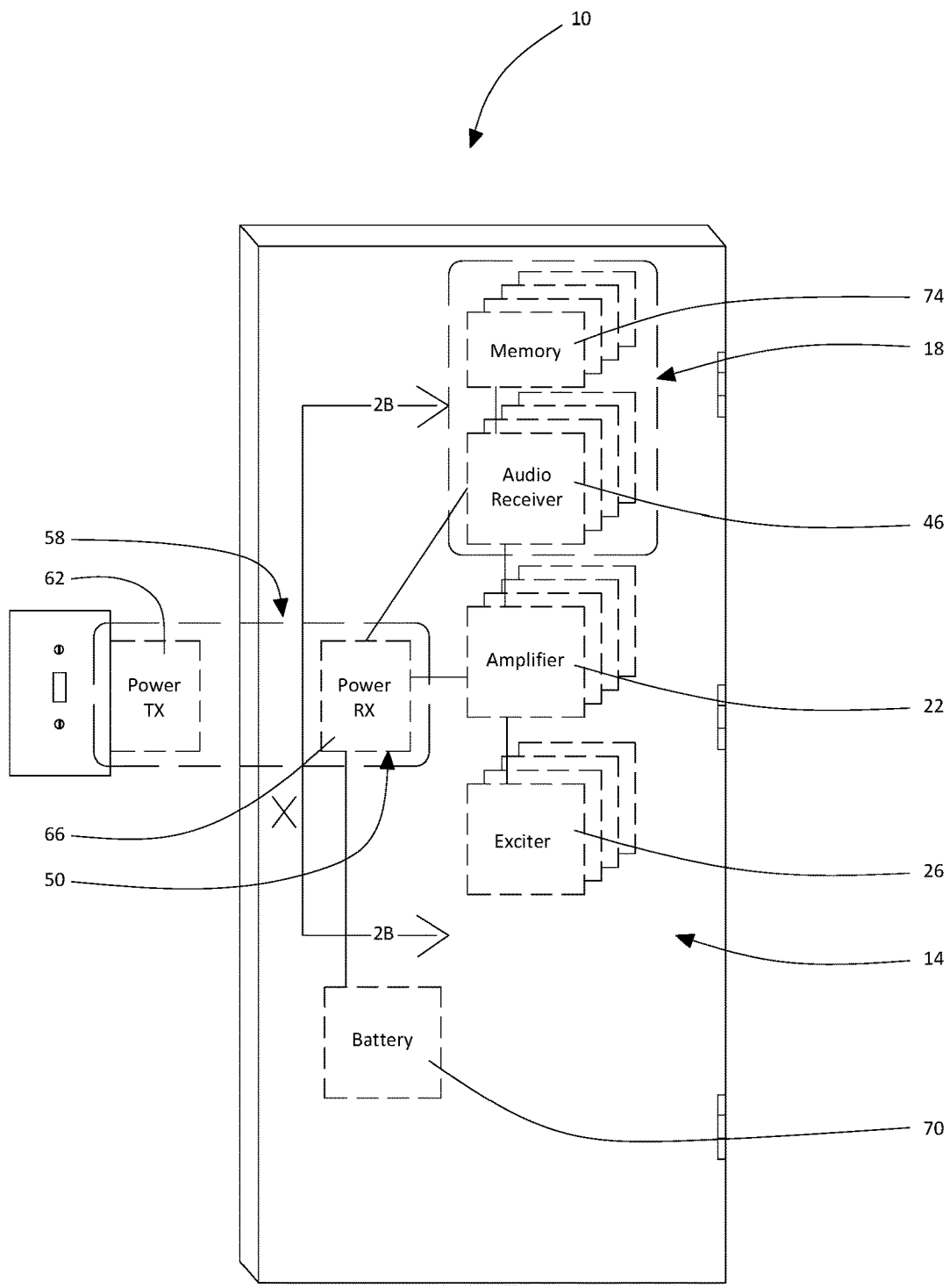
FIG. 2A illustrates one example of the audio door system of FIG. 1.
Figure 2B:
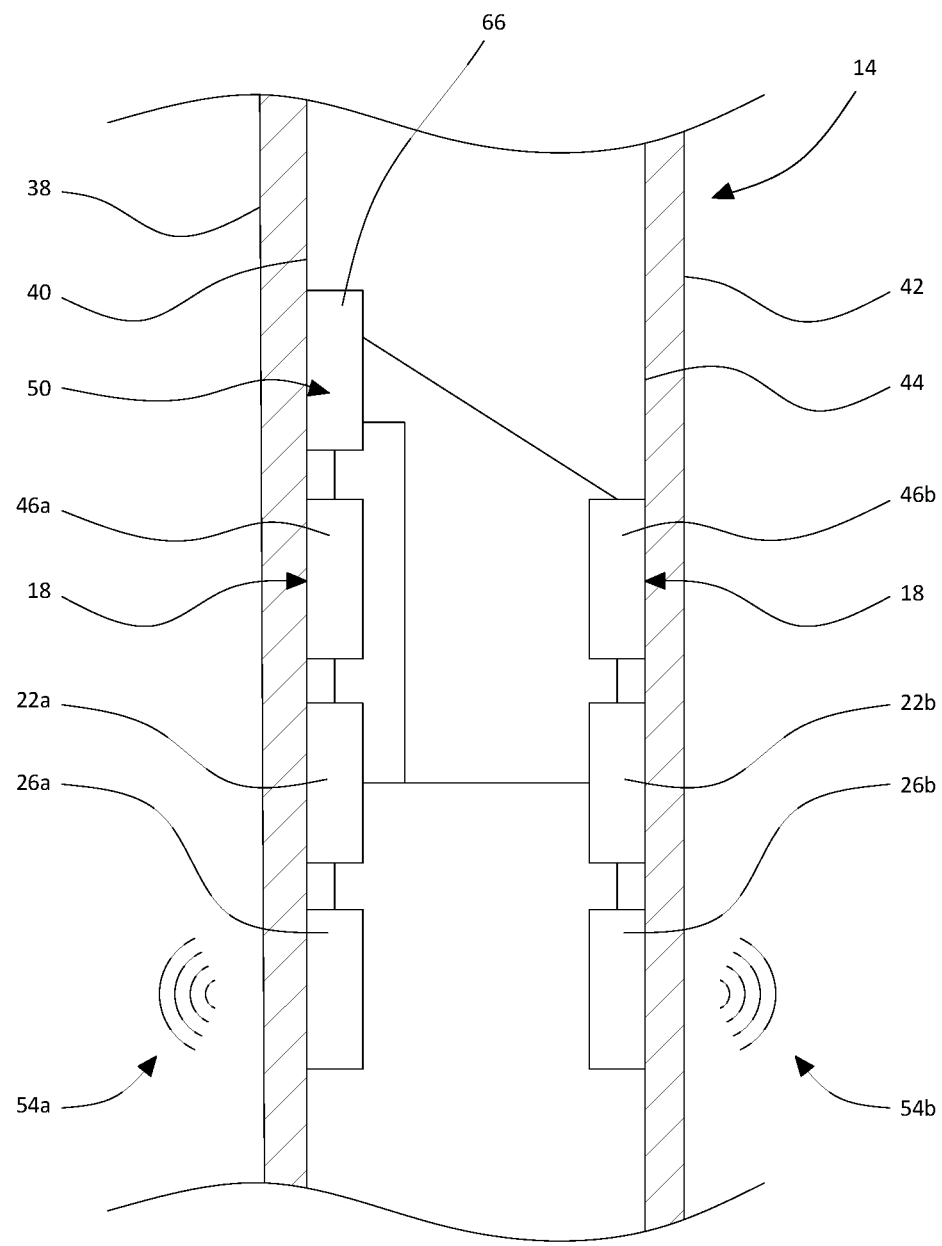
FIG. 2B is a cross-sectional view of a portion of the door of FIG. 2A along section line 2B-2B.

To power one or more of the components of the door 14, the audio door system 10 may further include a power source coupled to the door 14, and further electrically coupled directly or indirectly to the components of the door 14. One example of a power source is illustrated in FIGS. 2A-2B, as wireless power receiver 66. The power source refers to a device, one or more components, or a connector (e.g., an electrical coupling) that provides electrical power to the components of the door 14. Examples of a power source include a hardwired electrical connection (e.g., a hardwired connection to an electrical outlet or an electrical circuit included in the building), a battery, a wireless power source, a solar power source, any other power source, or any combination of the preceding.

In the example illustrated in FIG. 1, the audio door system 10 further includes a network 30 and the user device 34. Network 30 refers to any suitable network operable to facilitate communication between the components of audio door system 10, such as door(s) 14 and user device(s) 34. Network 30 may include any interconnecting system capable of transmitting audio, video, signals, data, messages, or any combination of the preceding. Network 30 may include all or a portion of a public or private data network, a local area network (LAN), a metropolitan area network (MAN), a wide area network (WAN), a wireless personal area network (WPAN), a local, regional, or global communication or computer network, such as the Internet, a wireline or wireless network, an enterprise intranet, or any other suitable communication link, including combinations thereof, operable to facilitate communication between the components. Preferable examples of network 30 may include a WPAN (which may include, for example, BLUETOOTH, BLUETOOTH low power, BLUETOOTH 5, ANT+, ZIGBEE (IEEE 802.15.4), other IEEE 802.15 protocols, IEEE 802.11 A, B or G without limitation, and WI-FI (IEEE 802.11)), a cellular communication network, an infrared communication network, any other wireless network operable to facilitate communication between the components, or any combination of the preceding.

The user device 34 refers to any device that receives data, stores data, and/or transmits data (e.g., audio). For example, the user device 34 may be (or may include) a personal computer, a laptop, a mobile telephone (such as a Smartphone), a watch (such as a Smartwatch), any other smart device (e.g., Smart television), an electronic tablet (e.g., IPAD), a personal digital assistant, any device that includes a wireless transmitter (e.g., BLUETOOTH wireless transmitter), any other computing or processing device, any other device for receiving data, storing data, and/or transmitting data, or any combination of the preceding. The user device 34 may include a computer/data processor and data storage medium (e.g., memory unit) comprising instructions executable by the processor to perform the functions of the user device 34. Additionally, the user device 34 may include a communication port (e.g., receiver, transmitter, transceiver, network interface) configured to receive and transmit information (e.g., audio) through network 30. In the example illustrated in FIG. 1, the user device 34 is a mobile telephone (e.g., a Smartphone).

A user may utilize the user device 34 to communicate with one or more doors 14 of the audio door system 10. For example, the user device 34 may include an "app" (such as a mobile application) or other software that is executed by the user device 34 to allow the user to communicate with one or more doors 14 of the audio door system 10. As another example, the user device 34 may access a website or execute a web browser to allow the user to communicate with one or more doors 14 of the audio door system 10.

The user may communicate with the audio door system 10 in order to transmit audio to be played by one or more doors 14 of the audio door system 10. For example, the user may select a particular audio file (e.g., select a track of white noise stored on or other accessible to the user device 34) to be played by one or more doors 14, may stream a particular audio channel (e.g., SPOTIFY) to be played by one or more doors 14, may create an audio file (e.g., by talking into the user device 34 so as, for example, to tell house occupants that "It is time for dinner") to be played by one or more doors 14 (e.g., in real-time or near real-time), may transmit audio in any other manner, or any combination of the preceding. In the illustrated example, to transmit the audio, the audio signals of the audio are wirelessly transmitted (e.g., via radio waves) from the user device 34, over the network 30, and to the audio system 18 (e.g., a wireless audio receiver). The audio system 18 may then provide the audio to the amplifier 22 and the exciter 26 in the form of electrical signals. These electrical signals are then transformed into mechanical energy (by the exciter 26), and then transformed into acoustic sound wave(s) (by the surface of the door 14), causing the door 14 to emit sound.

The user may also communicate with the audio door system 10 in order to control any other aspect of the audio door system 10 using the user device 34. For example, the user may utilize the user device 34 to (1) select which door 14 plays the audio (e.g., select the master bathroom door to play white noise, select all or a portion of the doors 14 to play music streamed from the user device 34, increase or decrease the volume of the audio played by the door 14, select a particular door 14 to play an audio message, such as "It's time for dinner"), (2) select which side of the door 14 plays the audio (e.g., select to play white noise on the first surface of the door 14 and/or to play speech privacy noise on the second surface of the door 14), (3) select how long the door 14 plays the audio (e.g., play continuously for 5 hours), (4) download audio (e.g., white noise noise) to a memory coupled to the door 14 (thereby allowing the downloaded audio to be played even when the door 14 cannot connect to the user device 34), (5) view the status of the door 14 (e.g., the door 14 is ajar, the battery of the door 14 is charging, the battery of the bathroom door is half full), (6) control any other aspect of the audio door system 10, or (7) any combination of the preceding.

Modifications, additions, or omissions may be made to audio door system 10 without departing from the scope of the disclosure. For example, the audio door system 10 may include any number of doors 14, audio systems 18, amplifiers 22, exciters 26, networks 30, and/or user devices 34 (and/or any number of components, such as processors or memory units illustrated or described in the above devices). Also, any suitable logic may perform the functions of audio door system 10 and the components and/or devices within audio door system 10. Furthermore, one or more components of audio door system 10 may be separated, combined, and/or eliminated. As one example of this, the amplifier 22 and the exciter 26 may be combined into a single device. As another example, the audio system 18, the amplifier 22, and the exciter 26 may be combined into a single device.

FIG. 2A illustrates one example of the audio door system 10 of FIG. 1, and FIG. 2B is a cross-sectional view of a portion of the door 14 of FIG. 2A along section line 2B-2B. In the example illustrated in FIGS. 2A-2B, the door 14 is a hollow-core door having a first skin 38 and a second skin 42 positioned opposite of the first skin 38 (as is seen in FIG. 2B). The first skin 38 and the second skin 42 may be made of any material that can be used to produce acoustic sound waves, such as fiberglass, steel, wood, any other material that can be used to produce acoustic sound waves, or any combination of the preceding.

As is seen in FIG. 2B, the amplifiers 22 (i.e., 22a-22b), the exciters 26 (i.e., 26a-26b), the wireless audio receivers 46 (i.e., 46a-46b, each of which is one example of an audio system 18), and the power source 50 are each coupled to the door 14 in locations in-between the first skin 38 and the second skin 42. More specifically, in the example illustrated in FIG. 2B, the exciter 26a is coupled to the internal surface 40 of the first skin 38, and the exciter 26b is coupled to the internal surface 44 of the second skin 42. In this example, the first skin 38 transforms the mechanical energy received from the exciter 26a into acoustic sound waves (illustrated as acoustic sound waves 54a), and the second skin 42 transforms the mechanical energy received from the exciter 26b into acoustic sound waves (illustrated as acoustic sound waves 54b). In some examples, this setup may create a door 14 with two audio zones so as to provide multichannel audio. The first audio zone may produce acoustic sound waves 54a, and the second audio zone may produce acoustic sound waves 54b. Audio may be played out of only the first audio zone, only the second audio zone, or both the first and second audio zones. Furthermore, when audio is played out of both the first and second audio zones, each audio zone may play the same audio, or different audio.

Figure 3:
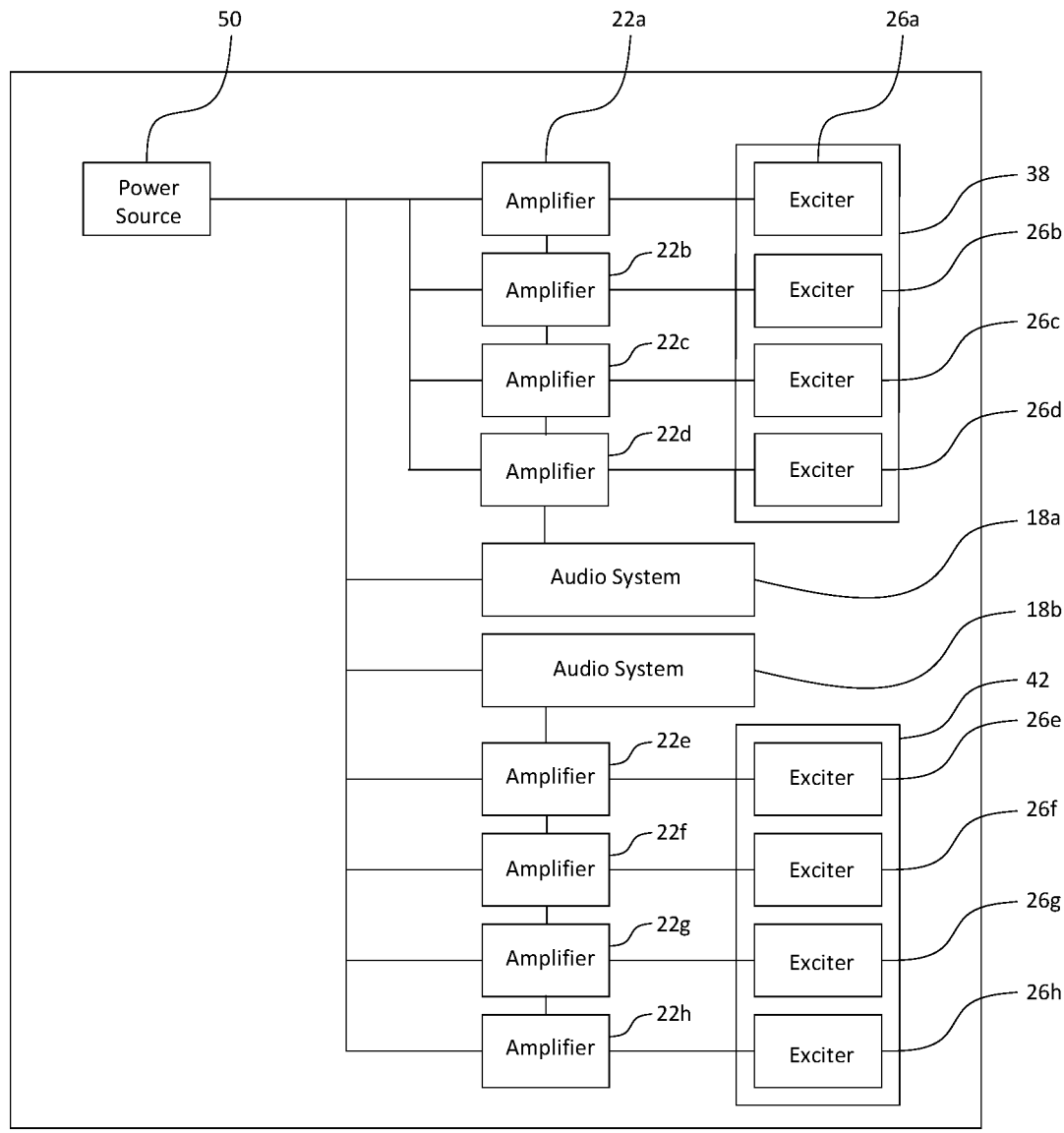
FIG. 3 is a block diagram of one example of a door for an audio door system.

Although FIG. 2B illustrates two exciters 26 within the door 14, the door 14 may include any number of exciters 26. For example, the door 14 may only include a single exciter 26 that is coupled to either the first skin 38 or the second skin 42. As another example, the door 14 may include two or more exciters 26 coupled to the first skin 38, and two or more exciters 26 coupled to the second skin 42. As one example of this, the door 14 may include four exciters 26 coupled to the first skin 38 (the combination of which form a first audio zone), and another four exciters 26 coupled to the second skin 42 (the combination of which form a second audio zone). An example of this is illustrated as a block diagram in FIG. 3. In FIG. 3, the first audio zone includes an audio system 18a electrically coupled to four amplifiers 22a-d and four exciters 26a-d (which are coupled to the first skin 38). The second audio zone includes an audio system 18b electrically coupled to four amplifiers 22e-h and four exciters 26e-h (which are coupled to the second skin 42). In other examples, a single audio system 18 may be electrically coupled to all of the exciters 26 (e.g., 26a-h), or each exciter 26 may be electrically coupled to its own audio system 18, or any combination in-between.

The exciters 26 may be positioned on the skins 38 and 42 in any location. In some examples, the exciters 26 may be positioned on the skins 38 and 42 in location(s) where the played audio may be more effective. For example, a first exciter 26 may be positioned at approximately 2 feet above finished floor to be at a level consistent with the height of a standing child, a second exciter 26 may be positioned at approximately 3-4 feet above finished floor to be at a level consistent with a person lying in bed or a person sitting at a desk, and a third exciter 26 may be positioned at approximately 4-6 feet above finished floor to be at a level consistent with the height of a standing adult.

In the example illustrated in FIGS. 2A-2B, the audio door system 10 includes a wireless power system 58 (shown in FIG. 2A) that can transmit electrical power without wires as a physical link (e.g., wireless resonant magnetic transmission). In the illustrated example, the wireless power system 58 includes a wireless power transmitter 62 and a wireless power receiver 66. The wireless power transmitter 62 refers to a device (or one or more components) that generates an electromagnetic field to transmit power across a space to a receiver device (such as wireless power receiver 66), and the wireless power receiver 66 refers to a device (or one or more components) that receives the electromagnetic field across the space, extracts the power from the electromagnetic field, and provides the power to one or more components. The wireless power transmitter 62 may be any wireless power transmitter that generates an electromagnetic field to transmit power across a space to a receiver device, and the wireless power receiver 66 may be any wireless power receiver that receives the electromagnetic field across the space, extracts the power from the electromagnetic field, and provides the power to one or more components. In some examples, the wireless power transmitter 62 is capable of transferring 12 VDC/3 A over a distance of up to 70 millimeters, and the wireless power receiver 66 is capable of receiving and distributing 36 W. In the illustrated example, the wireless power transmitter 62 and the wireless power receiver 66 are a 12V/3 A wireless power transmitter and a 36 W wireless power receiver manufactured by DFRROBOT (model number FIT0703).

The wireless power transmitter 62 transmits power (via the electromagnetic field) when the wireless power transmitter 62 is aligned with the wireless power receiver 66. In some examples, such an alignment (which causes the wireless transmission of power) refers to an alignment tolerance that allows for up to 25% of the coil diameter of the wireless power receiver 66 to be unaligned with the wireless power transmitter 62.

In the example illustrated in FIG. 2A, the wireless power transmitter 62 is electrically coupled to a light switch electrical circuit (e.g., electrical feed) that is positioned adjacent to the door 14. This positioning may allow the wireless power transmitter 62 to be driven by electrical power already available in the light switch electrical circuit. Furthermore, such positioning may be sufficiently near the door 14, so as to allow the wireless power transmitter 62 to wirelessly transmit power to the wireless power receiver 66 coupled to (e.g., within) the door 14. In other examples, the wireless power transmitter 62 may be electrically coupled to any other electrical circuit or electrical feed that allows the wireless power transmitter 62 to wirelessly transmit power to the wireless power receiver 66 coupled to (e.g., within) the door 14.

The wireless power transmitter 62 may be installed in any manner that allows it to be electrically coupled to a light switch electrical circuit (or other electrical circuit or electrical feed). For example, the wireless power transmitter 62 may be positioned in or on a mounting box, or in or on the light switch. In other examples, the wireless power transmitter 62 may be positioned in or on the light switch plate (or other wall plate). One example of the wireless power transmitter 62 positioned in or on the light switch plate is described below with regard to FIG. 5.

When the wireless power transmitter 62 is electrically coupled to a light switch electrical circuit (or other electrical circuit or electrical feed), the wireless power system 58 may include one or more transformers (not shown) positioned in-between the light switch electrical circuit (or other electrical circuit or electrical feed) and the wireless power transmitter 62. The transformer may transform an alternating current to a direct current. For example, the transformer may transform 100-240 VAC to 12 VDC. One example of the transformer is a DC X-former, such as a 12 VDC X-former manufactured by ALITOVE.

In the example illustrated in FIGS. 2A-2B, the wireless power receiver 66 is coupled within the door 14 (e.g., coupled in-between the first skin 38 and the second skin 42) at a location that is adjacent to the wireless power transmitter 62. This positioning may align the wireless power receiver 66 with the wireless power transmitter 62 when the door 14 is closed, causing the wireless power transmitter 62 to generate the electromagnetic field, and further causing the wireless power receiver 66 to receive the electromagnetic field, extract the power, and provide the power to one or more components (e.g., the audio system(s) 18, the amplifier(s) 22, the exciter(s) 26). As such, when the door 14 is open, the components coupled to the door 14 may not receive any electrical power from the wireless power system 58. However, when the door is closed, the components coupled to the door 14 may receive electrical power from the wireless power system 58, allowing the door 14 to emit sound. In some examples, the door 14 may power on within 2500 milliseconds of alignment between the wireless power transmitter 62 and the wireless power receiver 66. This can allow for the door 14 to automatically begin emitting sound when the door 14 is closed, in some examples. Furthermore, when the door 14 is powered on (via alignment of the wireless power transmitter 62 and the wireless power receiver 66), this status may be viewable by the user on the user device 34. That is, the user device 34 may display that the door is ajar (e.g., when there is no alignment between the wireless power transmitter 62 and the wireless power receiver 66) or closed (e.g., when there is alignment between the wireless power transmitter 62 and the wireless power receiver 66).

In the example illustrated in FIGS. 2A-2B, the wireless power receiver 66 is electrically coupled directly or indirectly to the wireless audio receivers 46, the amplifiers 22, and the exciters 26. This coupling allows the wireless power receivers 66 to provide power directly (or indirectly) to each of the wireless audio receivers 46, the amplifiers 22, and the exciters 26. In some examples, the wireless power system 58 may further include one or more buck converters (or step-down) converters positioned in-between the wireless power receiver 66 and the wireless audio receivers 46, the amplifiers 22, the exciters 26, or any other components. The buck converter may step down the voltage from its input (e.g., from the wireless power receiver 66) to its output (e.g., to the other components coupled to the door 14). One example of a buck converter is a DC-DC buck converter manufactured by NOOELEC (model number LM2596).

In the example illustrated in FIG. 2A, the door 14 optionally includes one or more batteries 70 coupled (e.g., within) the door 14. The battery 70 may provide power to one or more of the components of the door 14 when the wireless power receiver 66 is not receiving the magnetic field from the wireless power transmitter 62, such as when the door 14 is open. In some examples, the battery 70 allows the door 14 to play audio when the wireless power receiver 66 is not receiving the magnetic field from the wireless power transmitter 62. Furthermore, in some examples, the battery 70 also allows one or more components of the door 14 to remain active for 24 hours (or more) when the wireless power receiver 66 is not receiving the magnetic field from the wireless power transmitter 62.

In the example illustrated in FIG. 2A, the audio system 18 optionally includes one or more memory units 74. Memory unit 74 refers to any one or a combination of volatile or non-volatile local or remote devices suitable for storing information. For example, memory unit 74 may include random access memory (RAM), read only memory (ROM), magnetic storage devices, optical storage devices, any other suitable information storage device, or any combination of the preceding. Memory unit 74 may include any suitable information for use in the operation of the door 14. For example, memory unit 74 may store information in the form of one or more audio files (e.g., white noise files, music files). One or more of these audio files may be retrieved from memory unit 74, and may be played by the door 14. For example, if the wireless audio receiver 46 is having trouble communicating with the user device 34 (e.g., the user device 34 is out of range), the wireless audio receiver 46 may retrieve an audio file (e.g., sleep therapy profile (such as waterfall, rain, box fan, busy street), speech privacy profile (such as white noise, busy street)) from the memory unit 74 and cause the door 14 to play that retrieved audio file. As another example, the user may select to have the wireless audio receiver 46 play an audio file stored in the memory unit 74.

In addition to the components discussed above, the door 14 may include one or more additional components coupled to (e.g., within) the door 14. For example, the door 14 may optionally include a programmable button. The programmable button may be pushed (or otherwise activated) by a user, so as to cause the audio door system 10 to perform one or more functions. The programmable button may cause the audio door system 10 to perform any function of the audio door system 10. For example, activating the programmable button may cause the door 14 to play a particular stored audio file (e.g., a sleep therapy profile, speech privacy profile), may cause the door 14 to stop/start playing any audio, may cause the door 14 to start/stop streaming audio, may cause the door 14 or the audio door system 10 to perform any other function, or any combination of the preceding. In some examples, the user may change the function activated by the programmable button using the user device 34. Other example components of the door 14 may include a status indicator light that indicates whether the door 14 is playing audio, a power level indicator that indicates the battery level, transmitters (e.g., allowing the doors 14 to communicate with each other, such as to propagate a signal to a door 14 that is not currently in range of the user device 34), any other component(s), or any combination of the preceding.

FIG. 4 is a cross-sectional view of a portion of another example door 14. In the example illustrated in FIG. 4, the door 14 is a solid-core door having a first external surface 78 and a second external surface 82 positioned opposite of the first external surface 78. As is seen in FIG. 4, the audio system 18 (e.g., wireless audio receiver 46), the amplifier 22, the exciter 26, and the power source 50 (e.g., wireless power receiver 66) are coupled to the second external surface 82. Furthermore, these components are covered by an enclosure 86 (e.g., a panel, box, or other structure) that is also coupled the second external surface 82. This may prevent the components from being visible. In other examples, one or more (or all) of these components and the enclosure 86 may be coupled to the first external surface 86. In some examples, the enclosure 86 may be manufactured or sold with one or more of these components already in the enclosure 86. This may allow a door to be transformed into an audio door system 10 by coupling the enclosure 86 to the door.

Although the door 14 of FIG. 4 is illustrated as a solid-core door, in some examples, the door 14 may be any other door, such as a semi-solid door, a hollow-core door, any other type of door, or any combination of the preceding.

Figure 5:
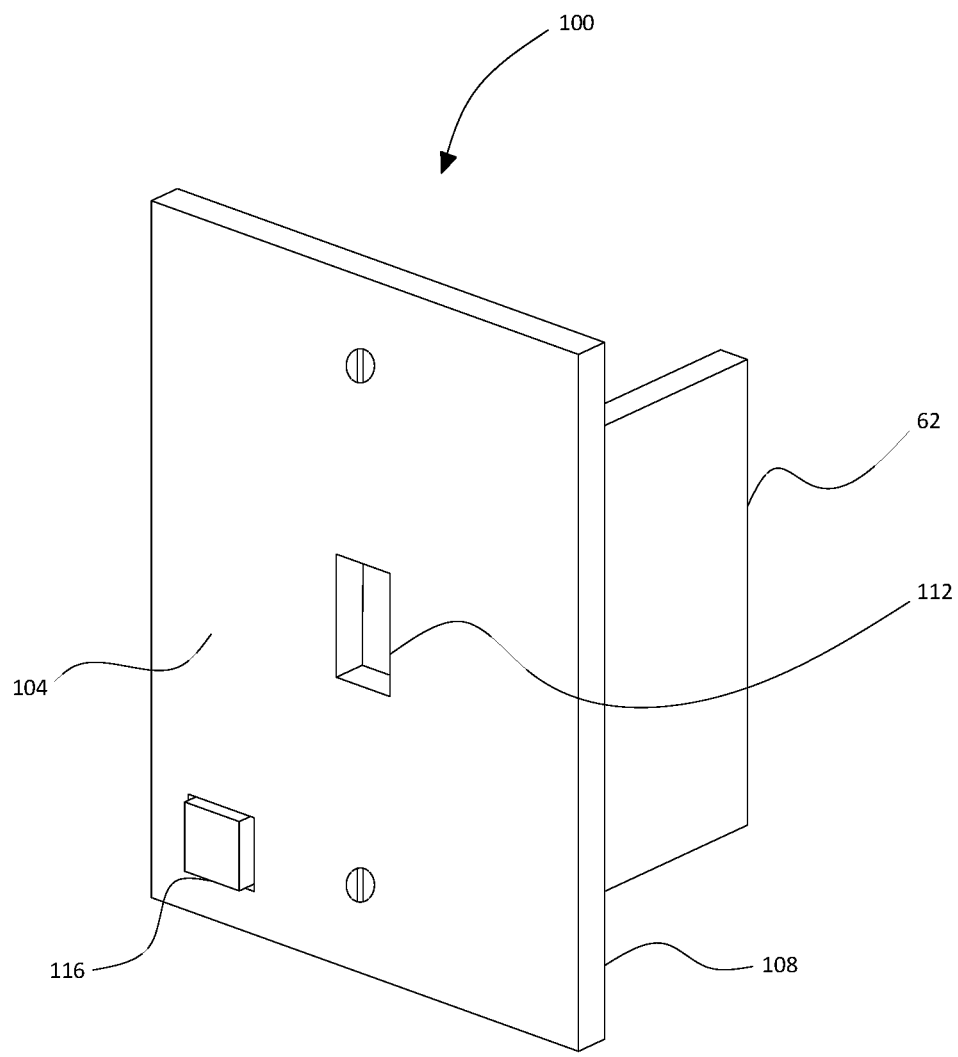
FIG. 5 illustrates an example light switch plate system for an audio door system.

FIG. 5 illustrates one example of a light switch plate system 100 for the audio door system 10. In the example illustrated in FIG. 5, the light switch plate system 100 includes a light switch plate 104 and a wireless power transmitter 62 coupled to a back surface 108 of the light switch plate 104. In some examples, the light switch plate system 100 of FIG. 5 may allow a user to install wireless power into a building, room, or structure by coupling the light switch plate 104 to a mounting box or to an existing light switch. In such an example, a user may remove the previous light switch plate, and install the light switch plate 104 (which already includes the wireless power transmitter 62) in its place, thereby providing wireless power capabilities to the building, room, or structure.

The light switch plate 104 refers to any light switch plate or cover that may be used to cover a mounting box and/or a light switch. The light switch plate 104 may have any size and/or shape. For example, the light switch plate 104 may cover a single light switch, or multiple light switches. In some examples, the light switch plate 104 may be any well-known or preexisting light switch plate, which has been modified to include the wireless power transmitter 62. The light switch plate 104 may include one or more openings 112, that allow the light switch toggle to extend through the light switch plate 104.

As is discussed above, the wireless power transmitter 62 may be coupled to a back surface 108 of the light switch plate 104. The wireless power transmitter 62 may be coupled to the back surface 108 of the light switch plate 104 in any manner, such as via an adhesive or soldering. The wireless power transmitter 62 may include an electrical connection (e.g., an electrical wire) that extends out of the wireless power transmitter 62, and that can be electrically coupled to the light switch electrical circuit (e.g., electrical feed) or the light switch (e.g., via a daisy chain connection). This may provide power to the wireless power transmitter 62.

In the example illustrated in FIG. 5, the light switch plate system 100 optionally includes a power interrupt button 116. The power interrupt button 116 may be pushed (or otherwise activated) by a user, so as to interrupt the electrical feed provided to the wireless power transmitter 62. This allows the user to turn the wireless power on and off using the power interrupt button 116, in some examples.

This specification has been written with reference to various non-limiting and non-exhaustive examples. However, it will be recognized by persons having ordinary skill in the art that various substitutions, modifications, or combinations of any of the disclosed examples (or portions thereof) may be made within the scope of this specification. Thus, it is contemplated and understood that this specification supports additional examples not expressly set forth in this specification. Such examples may be obtained, for example, by combining, modifying, or reorganizing any of the disclosed components, elements, features, aspects, characteristics, limitations, and the like, of the various non-limiting and non-exhaustive examples described in this specification. In this manner, Applicant reserves the right to amend the claims during prosecution to add features as variously described in this specification.

What is claimed is:
1. An audio door system, comprising:
a hollow-core door comprising a first skin and a second skin;
a first wireless audio receiver coupled to the hollow-core door in-between the first skin and the second skin of the hollow-core door;
a first amplifier coupled to the hollow-core door in-between the first skin and the second skin of the hollow-core door, and further electrically coupled to the first wireless audio receiver;
a first exciter coupled to an internal surface of the first skin of the hollow-core door, and further electrically coupled to the first amplifier, the first exciter configured to transform a first audio electrical signal into first mechanical energy, and further configured to cause the first skin of the hollow-core door to transform the first mechanical energy into one or more first acoustic sound waves;
a second wireless audio receiver coupled to the hollow-core door in-between the first skin and the second skin of the hollow-core door;
a second amplifier coupled to the hollow-core door in-between the first skin and the second skin of the hollow-core door, and further electrically coupled to the second wireless audio receiver; and
a second exciter coupled to an internal surface of the second skin of the hollow-core door, and further electrically coupled to the second amplifier, the second exciter configured to transform a second audio electrical signal into second mechanical energy, and further configured to cause the second skin of the hollow-core door to transform the second mechanical energy into one or more second acoustic sound waves.

2. An audio door system, comprising:
a door;
an audio system coupled to the door;
an amplifier coupled to the door, and further electrically coupled to the audio system;
an exciter coupled to the door, and further electrically coupled to the amplifier, the exciter configured to transform an audio electrical signal into mechanical energy, and further configured to cause a surface of the door to transform the mechanical energy into one or more acoustic sound waves;
a wireless power receiver coupled to the door, the wireless power receiver electrically coupled to the audio system, the amplifier, and the exciter;
a light switch plate configured to be coupled to a mounting box or to a light switch; and
a wireless power transmitter coupled to a back surface of the light switch plate, wherein the wireless power transmitter is configured to wirelessly transmit power to the wireless power receiver coupled to the door.

3. The audio door system of claim 2, wherein the audio system comprises a wireless audio receiver.

4. The audio door system of claim 3, wherein the wireless audio receiver is configured to receive audio signals streamed from a user device.

5. The audio door system of claim 3, wherein the wireless audio receiver is configured to receive audio signals through ultra-high frequency radio waves ranging from 2.402 GHz to 2.48 GHz.

6. The audio door system of claim 2, wherein the door is a hollow-core door comprising a first skin and a second skin.

7. The audio door system of claim 6, wherein the exciter is coupled to an internal surface of the first skin or the second skin of the hollow-core door, and wherein the exciter is configured to cause the first skin or the second skin of the hollow-core door to transform the mechanical energy into the one or more acoustic sound waves.

8. The audio door system of claim 2, wherein the door is a semi-solid door or a solid door.

9. The audio door system of claim 2, wherein the exciter is coupled to an external surface of the door.

10. The audio door system of claim 9, wherein the exciter is covered by an enclosure that is coupled to the external surface of the door.

11. A method, comprising:
coupling an audio system to a door;
coupling an amplifier to the door, and electrically coupling the amplifier to the audio system;
coupling an exciter to the door, and electrically coupling the exciter to the amplifier, wherein the exciter is configured to transform an audio electrical signal into mechanical energy, and further configured to cause a surface of the door to transform the mechanical energy into one or more acoustic sound waves;
coupling a wireless power receiver to the door; and
coupling a wireless power transmitter to a back surface of a light switch plate, wherein the light switch plate is configured to be coupled to a mounting box or to a light switch, wherein the wireless power transmitter is configured to wirelessly transmit power to the wireless power receiver coupled to the door.

12. The method of claim 11, wherein the audio system comprises a wireless audio receiver.

13. The method of claim 11, wherein the door is a hollow-core door comprising a first skin and a second skin.

14. The method of claim 13, wherein coupling an exciter to the door comprises coupling the exciter to an internal surface of the first skin or the second skin of the hollow-core door, and wherein the exciter is configured to cause the first skin or the second skin of the hollow-core door to transform the mechanical energy into the one or more acoustic sound waves.

15. The method of claim 11, wherein the door is a semi-solid door or a solid door.

\* \* \* \* \*